US012323125B2

(12) United States Patent
Yantchev

(10) Patent No.: US 12,323,125 B2
(45) Date of Patent: *Jun. 3, 2025

(54) SYMMETRIC TRANSVERSELY-EXCITED FILM BULK ACOUSTIC RESONATORS WITH REDUCED SPURIOUS MODES

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 160 days.

This patent is subject to a terminal disclaimer.

(21) Appl. No.: 17/736,100

(22) Filed: May 4, 2022

(65) Prior Publication Data
US 2022/0263490 A1 Aug. 18, 2022

Related U.S. Application Data

(63) Continuation of application No. 17/081,692, filed on Oct. 27, 2020, now Pat. No. 11,349,450, which is a (Continued)

(51) Int. Cl.
H03H 9/02 (2006.01)
H03H 3/04 (2006.01)
(Continued)

(52) U.S. Cl.
CPC .......... H03H 9/02228 (2013.01); H03H 3/04 (2013.01); H03H 9/02031 (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 7,042,132 B2   5/2006 Bauer et al.
7,939,987 B1   5/2011 Solal et al.
(Continued)

FOREIGN PATENT DOCUMENTS

CN   113765495 A   12/2021
JP   H06152299 A   5/1994
(Continued)

OTHER PUBLICATIONS

Table 1 of Capilla et al. (High Acoustic Impedance Ta2O5 layers for insulating acoustic reflectors, IEEE Transactions on Ultrasonics, Ferroelectrics, and Frequency Control, vol. 59, Issue: 3, Mar. 2012, pp. 366-372) (Year: 2012).*
(Continued)

Primary Examiner — Hafizur Rahman
(74) Attorney, Agent, or Firm — ARENTFOX SCHIFF LLP

(57) ABSTRACT

Acoustic resonators and filters are disclosed. An acoustic resonator includes a substrate and a piezoelectric plate. A back surface of the piezoelectric plate is attached to the substrate except for a portion of the piezoelectric plate forming a diaphragm spanning a cavity in the substrate. A conductor pattern including an interdigital transducer (IDT) is formed on a front surface of the piezoelectric plate, interleaved fingers of the IDT disposed on the diaphragm. A front-side dielectric layer is formed on the front surface of the piezoelectric plate between, but not over, the IDT fingers. A back-side dielectric layer is formed on a back surface of the diaphragm. Thicknesses of the IDT fingers and the front-side dielectric layer are substantially equal. An acoustic impedance Zm of the IDT fingers and an acoustic impedance Zfd of the front-side dielectric layer satisfy the relationship 0.8Zm≤Zfd≤1.25Zm.

20 Claims, 14 Drawing Sheets

Related U.S. Application Data continuation-in-part of application No. 16/920,173, filed on Jul. 2, 2020, now Pat. No. 11,139,794, which is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 63/045,916, filed on Jun. 30, 2020, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/17* (2006.01)
*H03H 9/56* (2006.01)
*H03H 3/02* (2006.01)

(52) U.S. Cl.
CPC ............ *H03H 9/132* (2013.01); *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01); *H03H 2003/0442* (2013.01)

(58) Field of Classification Search
CPC ........ H03H 9/176; H03H 9/562; H03H 9/564; H03H 9/568; H03H 2003/023; H03H 2003/0442
USPC ......................................................... 333/192
See application file for complete search history.

(56) References Cited

U.S. PATENT DOCUMENTS

| | | |
|---|---|---|
| 7,965,015 B2 | 6/2011 | Tai et al. |
| 9,112,134 B2 | 8/2015 | Takahashi |
| 9,240,768 B2 | 1/2016 | Nishihara et al. |
| 9,525,398 B1 | 12/2016 | Olsson et al. |
| 9,564,873 B2 | 2/2017 | Kadota |
| 9,748,923 B2 | 8/2017 | Kando et al. |
| 10,284,176 B1 | 5/2019 | Solal |
| 10,819,309 B1 | 10/2020 | Turner et al. |
| 10,868,510 B2 | 12/2020 | Yantchev |
| 10,985,728 B2 | 4/2021 | Plesski et al. |
| 10,998,882 B2 | 5/2021 | Yantchev et al. |
| 11,146,232 B2 | 10/2021 | Yandrapalli et al. |
| 11,201,601 B2 | 12/2021 | Yantchev et al. |
| 11,349,450 B2 * | 5/2022 | Yantchev ........... H03H 9/02228 |
| 11,418,167 B2 | 8/2022 | Garcia |
| 2002/0079986 A1 | 6/2002 | Ruby et al. |
| 2004/0041496 A1 | 3/2004 | Imai et al. |
| 2005/0099091 A1 | 5/2005 | Mishima et al. |
| 2007/0188047 A1 | 8/2007 | Tanaka |
| 2007/0278898 A1 | 12/2007 | Miura et al. |
| 2007/0296304 A1 | 12/2007 | Fujii et al. |
| 2010/0223999 A1 | 9/2010 | Onoe |
| 2010/0301703 A1 | 12/2010 | Chen et al. |
| 2011/0102107 A1 | 5/2011 | Onzuka |
| 2013/0057360 A1 | 3/2013 | Meltaus et al. |
| 2013/0207747 A1 | 8/2013 | Nishii et al. |
| 2013/0234805 A1 | 9/2013 | Takahashi |
| 2013/0271238 A1 | 10/2013 | Onda et al. |
| 2014/0009032 A1 | 1/2014 | Takahashi et al. |
| 2014/0113571 A1 | 4/2014 | Fujiwara et al. |
| 2014/0152145 A1 | 6/2014 | Kando et al. |
| 2015/0244149 A1 | 8/2015 | Van Someren |
| 2016/0079958 A1 | 3/2016 | Burak |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2017/0187352 A1 | 6/2017 | Omura |
| 2017/0201232 A1 | 7/2017 | Nakamura et al. |
| 2017/0214385 A1 | 7/2017 | Bhattacharjee |
| 2017/0264266 A1 | 9/2017 | Kishimoto |
| 2017/0290160 A1 | 10/2017 | Takano et al. |
| 2018/0013400 A1 | 1/2018 | Ito et al. |
| 2018/0013405 A1 | 1/2018 | Takata |
| 2018/0152169 A1 | 5/2018 | Goto et al. |
| 2018/0212589 A1 | 7/2018 | Meltaus et al. |
| 2018/0262179 A1 | 9/2018 | Goto et al. |
| 2018/0316333 A1 | 11/2018 | Nakamura et al. |
| 2019/0007022 A1 | 1/2019 | Goto et al. |
| 2019/0068155 A1 | 2/2019 | Kimura et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0348966 A1 | 11/2019 | Campanella-Pineda et al. |
| 2019/0386638 A1 | 12/2019 | Kimura et al. |
| 2020/0021271 A1 | 1/2020 | Plesski |
| 2020/0021272 A1 | 1/2020 | Segovia Fernandez et al. |
| 2020/0228087 A1 | 7/2020 | Michigami et al. |
| 2020/0244247 A1 | 7/2020 | Maeda |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2021/0152154 A1 | 5/2021 | Tang et al. |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0052669 A1 | 2/2022 | Schäufele et al. |
| 2022/0103160 A1 | 3/2022 | Jachowski et al. |
| 2022/0116014 A1 * | 4/2022 | Poirel .................. H03H 9/6483 |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| JP | 2002300003 A | 10/2002 |
| JP | 2004096677 A | 3/2004 |
| JP | 2007329584 A | 12/2007 |
| JP | 2010062816 A | 3/2010 |
| JP | 2010233210 A | 10/2010 |
| JP | 2012049758 A | 3/2012 |
| JP | 2013528996 A | 7/2013 |
| JP | 2013214954 A | 10/2013 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2013128636 A1 | 9/2013 |
| WO | 2015098694 A1 | 7/2015 |
| WO | 2016017104 A1 | 2/2016 |
| WO | 2016052129 A1 | 4/2016 |
| WO | 2016147687 A1 | 9/2016 |
| WO | 2017188342 A1 | 11/2017 |
| WO | 2018163860 A1 | 9/2018 |
| WO | 2019138810 A1 | 7/2019 |
| WO | 2020100744 A1 | 5/2020 |

OTHER PUBLICATIONS

Yang et al., "5 GHz Lithium Niobate MEMS Resonators with High FOM of 153," MEMS 2017, Jan. 22-26, 2017, pp. 942-945.

Lam et al., "A Review of Lame and Lamb Mode Crystal Resonators for Timing Applications and Prospects of Lame and Lamb Mode Piezo MEMS Resonators for Filtering Applications," 2018 Interna-

(56) References Cited

OTHER PUBLICATIONS tional Symposium on Acoustic Wave Devices for Future Mobile Communication Systems, Mar. 6-7, 2018, 12 pages.

\* cited by examiner

SYMMETRIC TRANSVERSELY-EXCITED FILM BULK ACOUSTIC RESONATORS WITH REDUCED SPURIOUS MODES

RELATED APPLICATION INFORMATION

This patent is a continuation of patent application Ser. No. 17/081,692, filed Oct. 27, 2020, entitled SYMMETRIC TRANSVERSELY-EXCITED FILM BULK ACOUSTIC RESONATORS WITH REDUCED SPURIOUS MODES which claims priority from provisional patent application 63/045,916, filed Jun. 30, 2020, entitled SYMMETRIC XBAR TOPOLOGIES FOR SPUR CONTROL. Patent application Ser. No. 17/081,692 is a continuation-in-part of application Ser. No. 16/920,173, entitled TRANSVERSELY-EXCITED FILM BULK ACOUSTIC RESONATOR, filed Jul. 2, 2020, now U.S. patent Ser. No. 11/139,794, which is a continuation of application Ser. No. 16/438,121, entitled TRANSVERSELY-EXCITED FILM BULK ACOUSTIC RESONATOR, filed Jun. 11, 2019, now U.S. Pat. No. 10,756,697, which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter.

A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
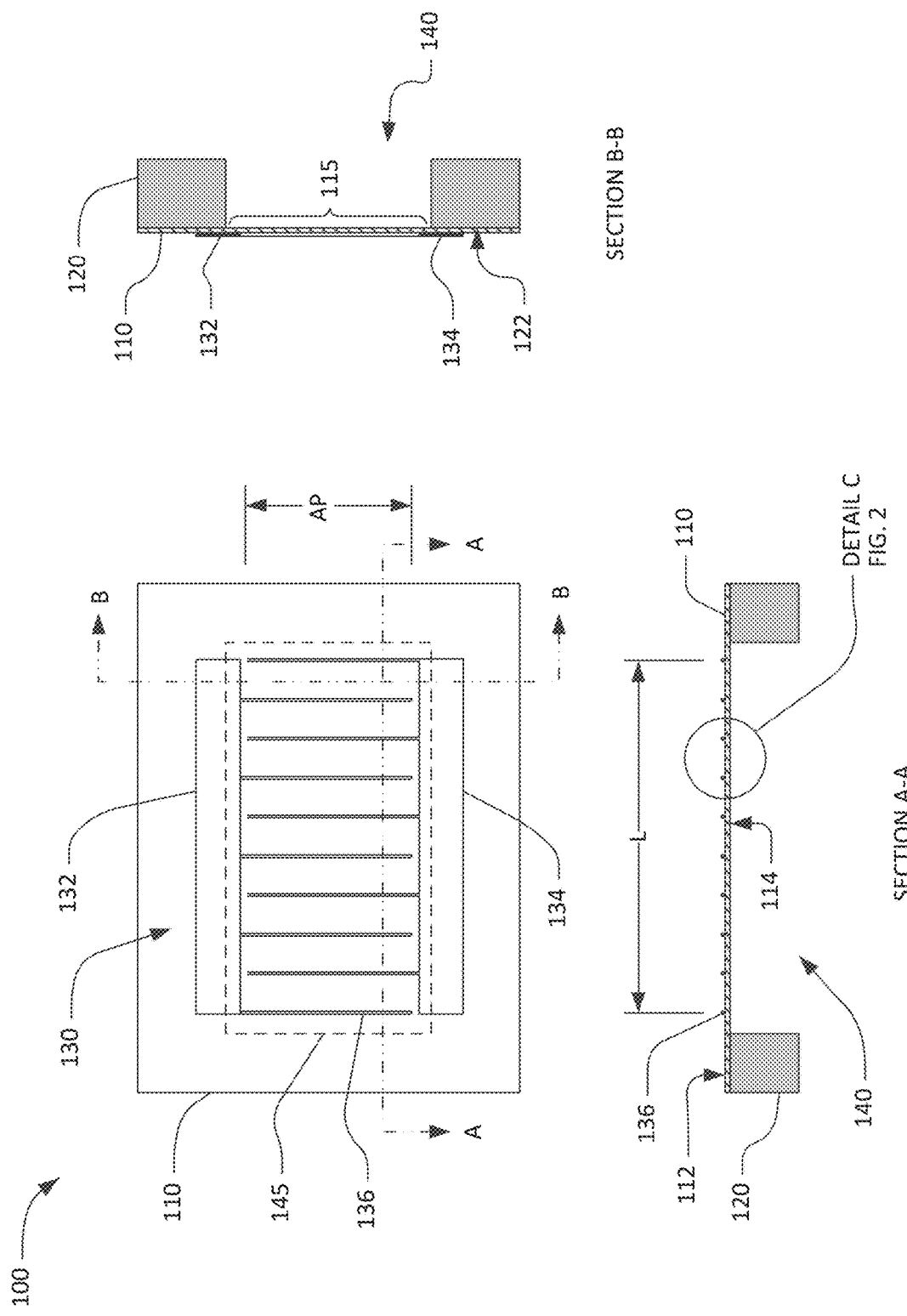
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 is made up of a thin film conductor pattern formed on a surface of a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are rotated YX-cut. However, XBARs may be fabricated on piezoelectric plates with other crystallographic orientations including Z-cut and rotated Z-cut.

The back surface 114 of the piezoelectric plate 110 is attached to a surface 122 of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved IDT fingers overlap for a distance AP, commonly referred to as the "aperture" of the IDT. The center-to-center distance L between the outermost fingers of the IDT 130 is the "length" of the IDT.

The term "busbar" refers to the conductors that interconnect the first and second sets of fingers in an IDT. As shown in FIG. 1, each busbar 132, 134 is an elongated rectangular conductor with a long axis orthogonal to the interleaved IDT fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have hundreds, possibly thousands, of parallel fingers in the IDT 110. Similarly, the thickness of the fingers in the cross-sectional views is greatly exaggerated in the drawings.

Figure 2:
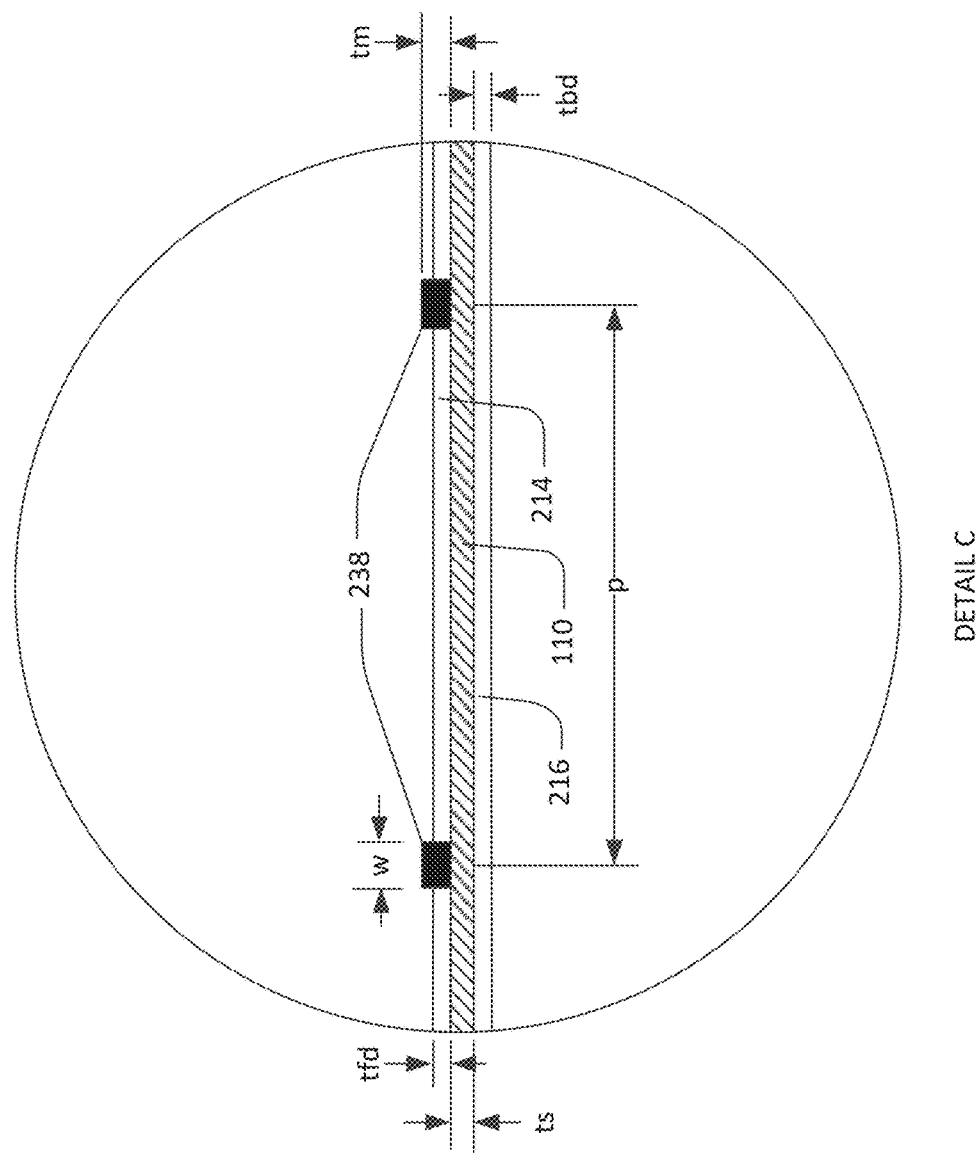
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 238. Although not shown in FIG. 2, the front-side dielectric layer 214 may also be deposited over the IDT fingers 238. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum, a substantially aluminum alloy, copper, a substantially copper alloy, beryllium, gold, molybdenum, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers. As shown in FIG. 2, the IDT fingers 238 have rectangular cross-sections. The IDT fingers may have some other cross-sectional shape, such as trapezoidal.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
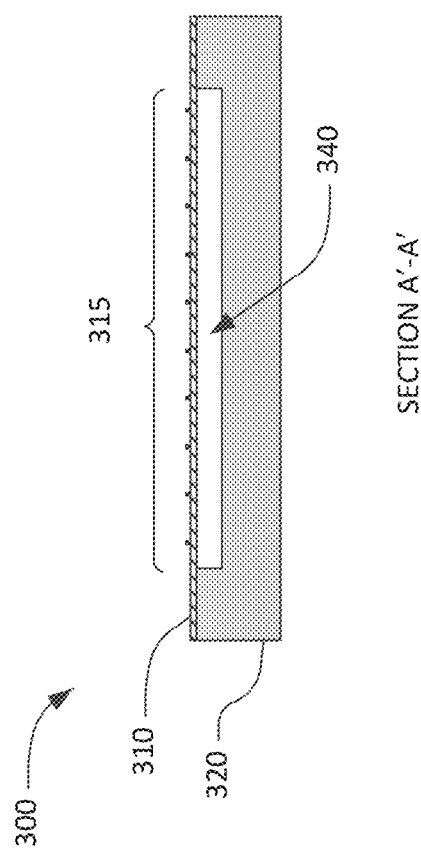
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
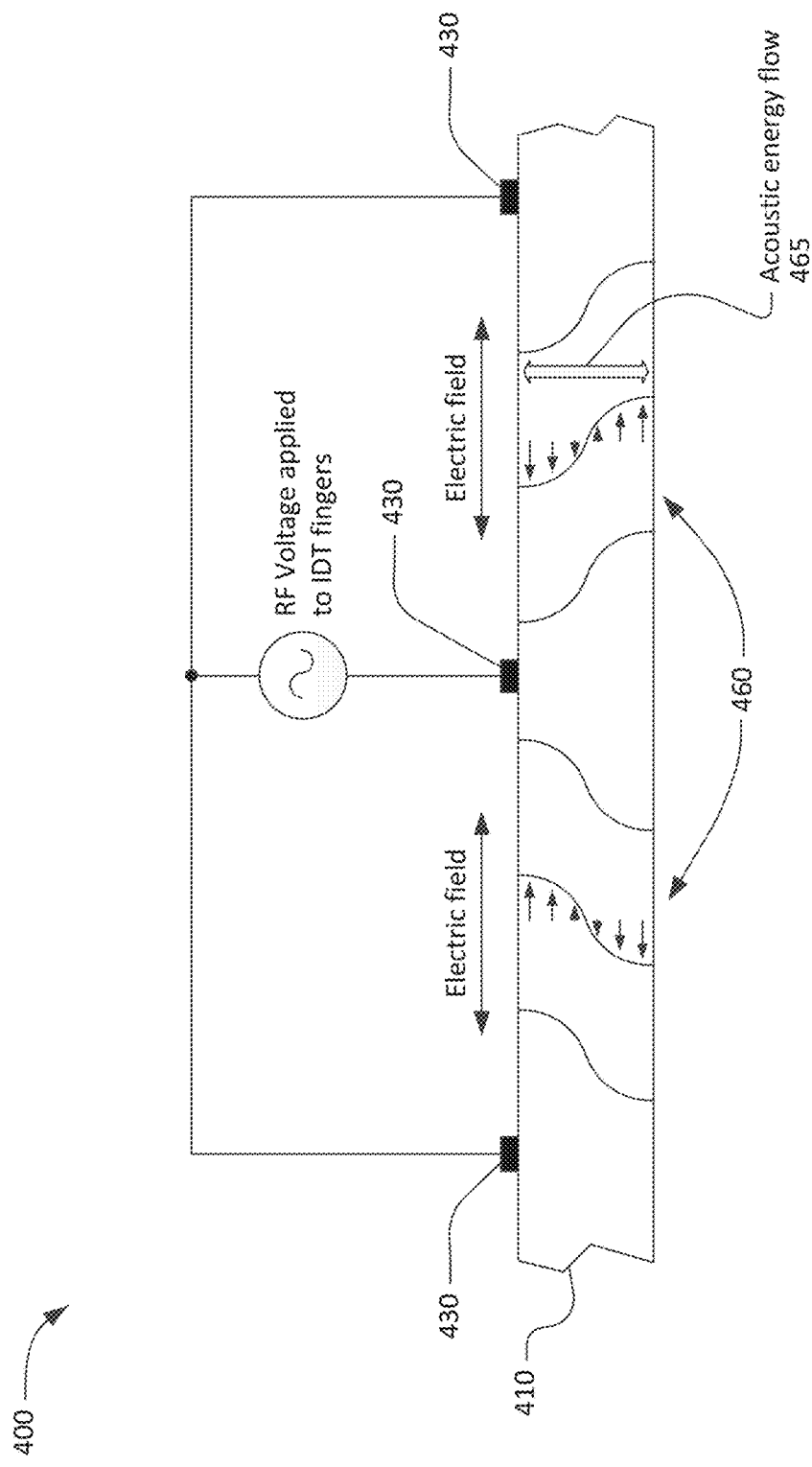
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
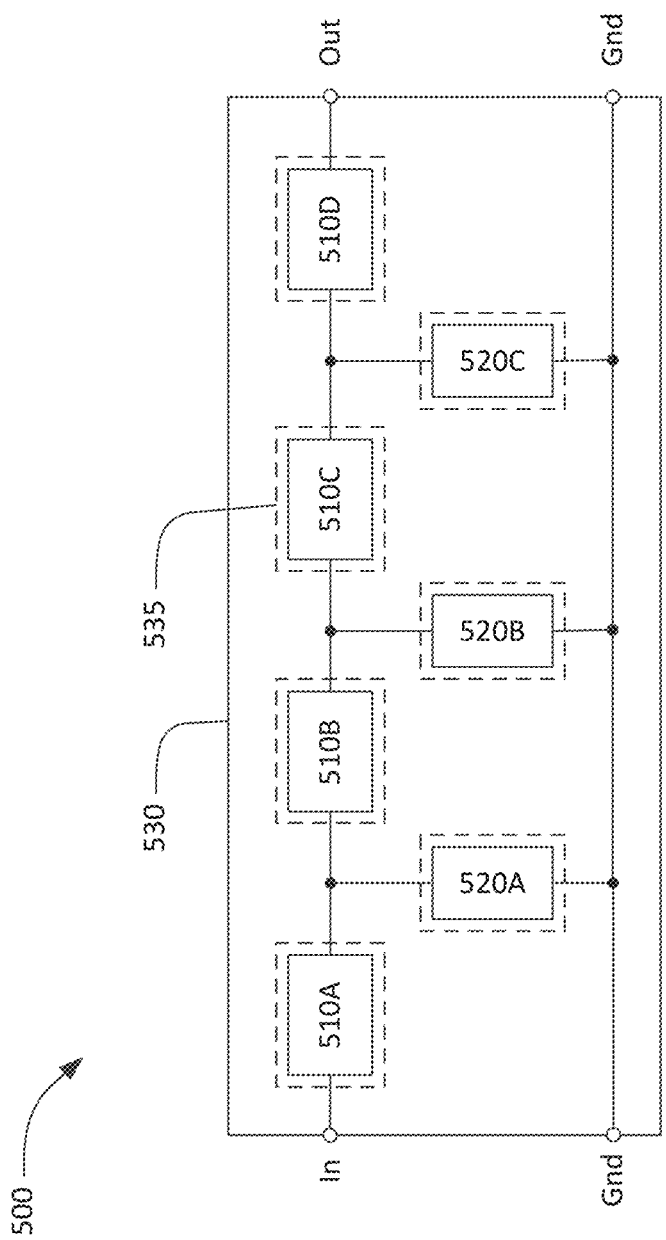
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including four series resonators 510A, 510B, 510C, 510D and three shunt resonators 520A, 520B, 520C. The series resonators 510A, 510B, 510C, and 510D are connected in series between a first port and a second port (hence the term "series resonator"). In FIG. 5, the first and second ports are labeled "In" and "Out", respectively. However, the filter 500 is bidirectional and either port may serve as the input or output of the filter. The shunt resonators 520A, 520B, 520C are connected from nodes between the series resonators to ground. A filter may contain additional reactive components, such as inductors, not shown in FIG. 5. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 500, the series resonators 510A, B, C, D and the shunt resonators 520A, B, D of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 510D, 520A, 520B, 520C in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Figure 6:
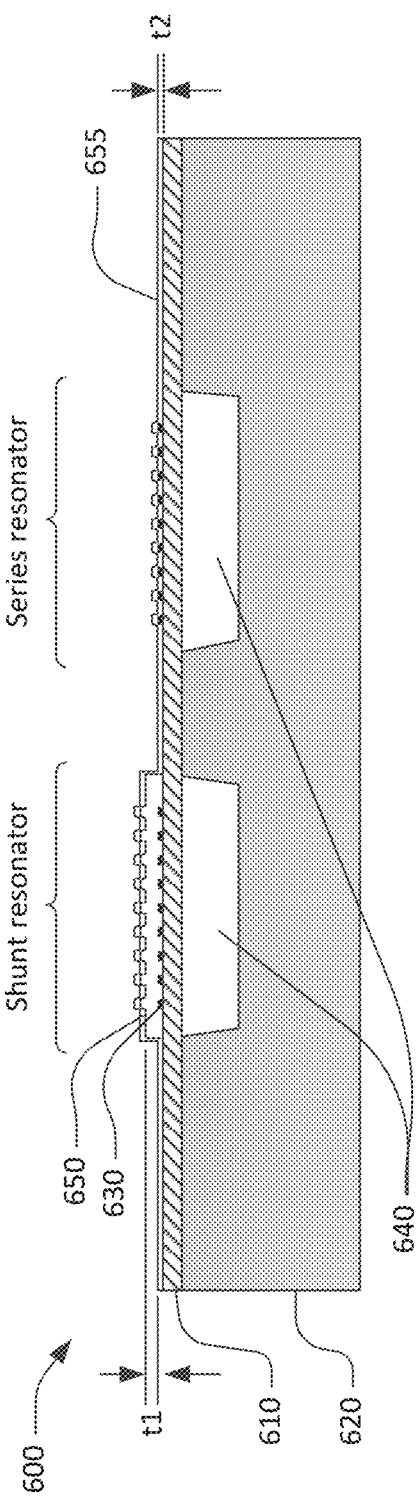
FIG. 6 is a schematic cross-sectional view of two XBARs illustrating a frequency-setting dielectric layer.

FIG. 6 is a schematic cross-sectional view through a shunt resonator and a series resonator of a filter 600 that uses a dielectric frequency setting layer to separate the resonance frequencies of shunt and series resonators. A piezoelectric plate 610 is attached to a substrate 620. Portions of the piezoelectric plate 610 form diaphragms spanning cavities 640 in the substrate 620. Interleaved IDT fingers, such as finger 630, are formed on the diaphragms. A first dielectric layer 650, having a thickness t1, is formed over the IDT of the shunt resonator. The first dielectric layer 650 is considered a "frequency setting dielectric layer", which is a layer of dielectric material applied to a first subset of the resonators in a filter to offset the resonance frequencies of the first subset of resonators with respect to the resonance frequencies of resonators that do not receive the frequency setting dielectric layer. The frequency setting dielectric layer is commonly $SiO_2$ but may be silicon dioxide, silicon nitride, aluminum oxide, aluminum nitride, beryllium oxide, tantalum oxide, tungsten oxide, or some other dielectric material. The frequency setting dielectric layer may be a laminate or composite of two or more dielectric materials.

A second dielectric layer 655, having a thickness t2, may be deposited over both the shunt and series resonators. The second dielectric layer 655 serves to seal and passivate the surface of the filter 600. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 600. Thus, the second dielectric layer can be referred to as the "passivation and tuning layer".

The resonance frequency of an XBAR is roughly proportional to the inverse of the total thickness of the diaphragm including the piezoelectric plate 610 and the dielectric layers 650, 655. The diaphragm of the shunt resonator is thicker than the diaphragm of the series resonator by the thickness t1 of the dielectric frequency setting layer 650. Thus, the shunt resonator will have a lower resonance frequency than the series resonator. The difference in resonance frequency between series and shunt resonators is determined by the thickness t1.

As previously described, the primary acoustic mode in an XBAR is a shear mode. However other modes may also be excited. To avoid unacceptable distortions in the performance of a filter, such spurious modes must be controlled by either reducing the magnitude of the spurious mode to a negligible level and/or moving the spurious mode to a frequency where the spurious mode does not have a negative impact on filter performance.

Spurious modes in XBARs often originate from the lowest order antisymmetric Lamb wave (A0) and its specific interaction with the primary shear mode in the presence of the IDT fingers. The asymmetric structure of a conventional XBAR, with IDT fingers and dielectric layers on only one side of the piezoelectric diaphragm, facilitates excitation of spurious modes. Spurious modes can be controlled, to some extent, by proper selection of the IDT pitch and mark. This method provides control over some selected spurs near passband but not the out of band spurs, where their presence affects the ability to satisfy stop-band rejection specifications.

A symmetric structure has a potential to significantly reduce the spur content over a wide frequency band. The most symmetric structure would be to replicate the IDT fingers and dielectric layers on both sides of the piezoelectric diaphragm. An alternative, almost symmetric, structure would be to add dielectric fingers with similar acoustic properties to the conductive IDT fingers to the back surface of the diaphragm. In either of these approaches, the fingers on the back side of the diaphragm would have to be formed (i.e. deposited and patterned) prior to bonding the piezoelectric diaphragm to the supporting substrate. This would greatly complicate the XBAR fabrication process.

Figure 7:
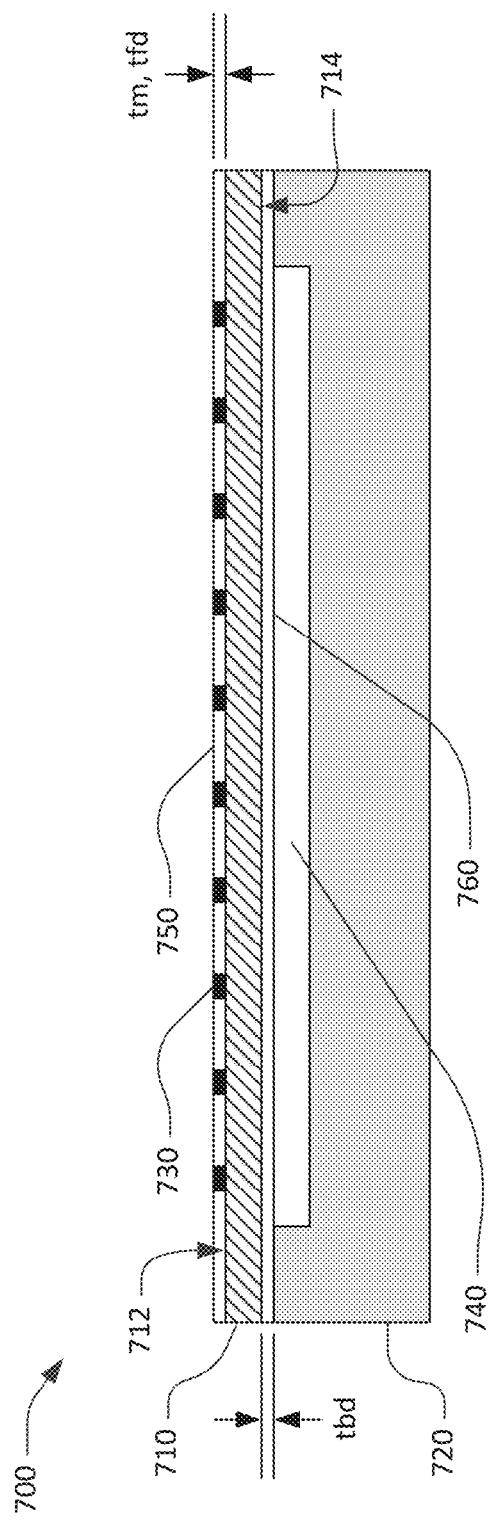
FIG. 7 is a cross-section view of a symmetrical XBAR with embedded IDT fingers on the front surface of a piezoelectric diaphragm and a continuous dielectric layer on the back surface of the diaphragm.

FIG. 7 is a schematic cross-sectional view of an effectively symmetric XBAR 700. The XBAR 700 includes a piezoelectric plate 710 supported by a substrate 720. The piezoelectric plate 710 may be Z-cut, rotated Z-cut, or rotated YX-cut lithium niobate or lithium tantalate. The substrate 720 may be silicon or some other material that allows the formation of deep cavities by, for example, isotropic etching. A portion of the piezoelectric plate 710 forms a diaphragm spanning a cavity 740 in the substrate 720.

IDT fingers, such as finger 730, are formed on a front surface 712 of the diaphragm portion (i.e. the portion spanning the cavity 740) of the piezoelectric plate 710. The IDT fingers have a thickness tm. A front-side dielectric layer 750 is formed on the front surface 712 of the piezoelectric plate between, but not over, the IDT fingers. The front-side dielectric layer 750 has a thickness tfd. A back-side dielectric layer 760 is formed on a back surface 714 of the piezoelectric plate. The back-side dielectric layer 760 has a thickness tbd.

The XBAR structure shown in FIG. 7 has two potential benefits over the XBAR structure shown in the previous figures. First, the presence of the front-side dielectric layer 750 between but not over the IDT fingers 730 reduces reflections from the IDT fingers for laterally propagating (i.e. propagating in the left-right direction in FIG. 7) spurious modes. Reducing these reflections minimizes constructive interference of the laterally propagating modes and thus reduces their magnitude.

Acoustic impedance Z is generally defined as the product of density and propagation velocity of a material. Since the primary acoustic mode of an XBAR is a shear mode, in this patent the term "acoustic impedance" is specifically defined as the product of density and shear mode propagation velocity. The unit of measurement for acoustic impedance is the "Rayl". The reflections from the IDT fingers 730 are determined, in part, by the acoustic impedance mismatch between the fingers and their environment. Ideally, when the thickness and acoustic impedance of the IDT fingers 730 and the front-side dielectric layer 750 are equal, reflections from the IDT fingers for these modes may be minimized. Although a precise impedance match between the IDT fingers and the front-side dielectric layer is not practical, several combinations of metal and dielectric materials have sufficiently similar acoustic properties to substantially reduce reflection from the IDT fingers. For example, the combination of aluminum (Z=8.45 MRayl) and silicon dioxide (Z=8.3 MRayl) or the combination of copper (Z=20.25 MRayl) and tantalum oxide ($Ta_2O_5$, Z=22.6 MRayl) may be used for the IDT fingers 730 and front-side dielectric layer 750, respectively. Other metal/dielectric combinations may be used. Preferably. other metal dielectric combinations will satisfy the relationship $0.8Zm \leq Zfd \leq 1.25Zm$, where Zm is the acoustic impedance of the metal IDT fingers 730 and Zfd is the acoustic impedance of the front-side dielectric layer 750.

A second benefit of the XBAR structure shown in FIG. 7 is the presence of dielectric layers 750, 760 on both sides of the diaphragm, which may reduce coupling to certain spurious modes. In this patent, the term "acoustic thickness" is defined as the thickness of a structure measured in wavelengths of the primary shear acoustic wave in the material of the structure. The term "thickness" means the physical or mechanical thickness. The XBAR 700 is considered symmetrical if the acoustic thickness of the front-side dielectric layer 750 and the acoustic thickness of the back-side dielectric layer 760 are substantially equal. "Substantially equal" means "as equal as practical within normal manufacturing tolerances".

However, substantial equality of the XBAR 700 is preferred but not necessary to achieve a significant reduction in spurious modes. Some spurious modes may be reduced if the acoustic thickness of the back-side dielectric layer 760 is at least one-third and less than two-thirds of the total acoustic thickness of the back-side and front-side dielectric layers 760, 750. When the front-side and back-side dielectric layers are the same material, significant reduction of at least some spurious modes will be achieved when $0.5 \text{ tfd} \leq \text{tbd} \leq 1.5 \text{ tfd}$.

Figure 8:
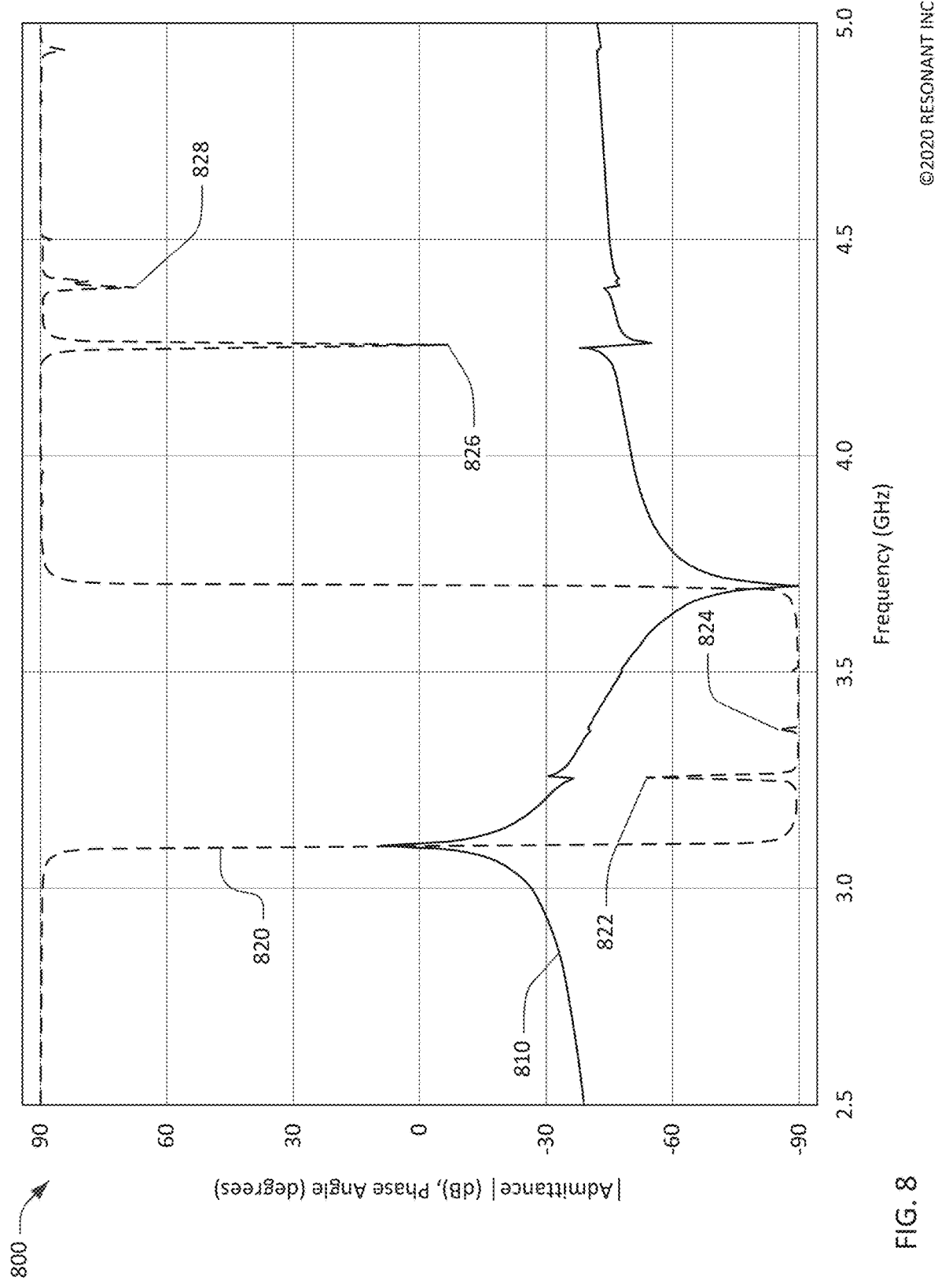
FIG. 8 is a graph of the magnitude and phase angle of the admittance of an XBAR as shown in FIG. 7.

Euler angles are a system, introduced by Swiss mathematician Leonhard Euler, to define the orientation of a body with respect to a fixed coordinate system. The orientation is defined by three successive rotations, by angles $\alpha$, $\beta$, and $\gamma$, about defined axes. FIG. 8 is a graph 800 of the admittance of an XBAR having the structure shown in FIG. 7. The piezoelectric plate is lithium niobate with Euler angles [0°, 38°, 0°]. For historical reasons, this plate configuration is commonly referred to as "128-degree Y-cut", where the "cut angle" is the angle between the y axis and the normal to the plate. The "cut angle" is equal to $\beta+90°$. The piezoelectric plate thickness is 445 nm. The thickness of the aluminum IDT fingers and the silicon dioxide dielectric layers is 145 nm, or 0.326 times the thickness of the piezoelectric plate. The pitch of the IDT fingers is 4.5 microns and the mark/pitch ratio is 0.24.

In FIG. 8, the solid curve 810 is a plot of the magnitude of the admittance of the XBAR as a function of frequency. The dashed line 820 is a plot of the phase of the admittance of the XBAR as a function of frequency. For an ideal acoustic resonator, the phase of the admittance is 90 degrees below the resonance frequency and above the anti-resonance frequency, and −90 degrees between the resonance and anti-resonance frequencies. Spurious modes cause phase errors and perturbations in the magnitude of the admittance.

In this example, the resonance frequency of the XBAR is about 3.1 GHz and the anti-resonance frequency is about 3.7 GHz. There are significant spurious modes 822, 824 between the resonance and anti-resonance frequencies, and additional spurious modes 826, 828 above the antiresonance frequency. The substantial spurious mode 826 is an A1-3 mode, which is the third harmonic of the primary shear mode of the XBAR.

Figure 9:
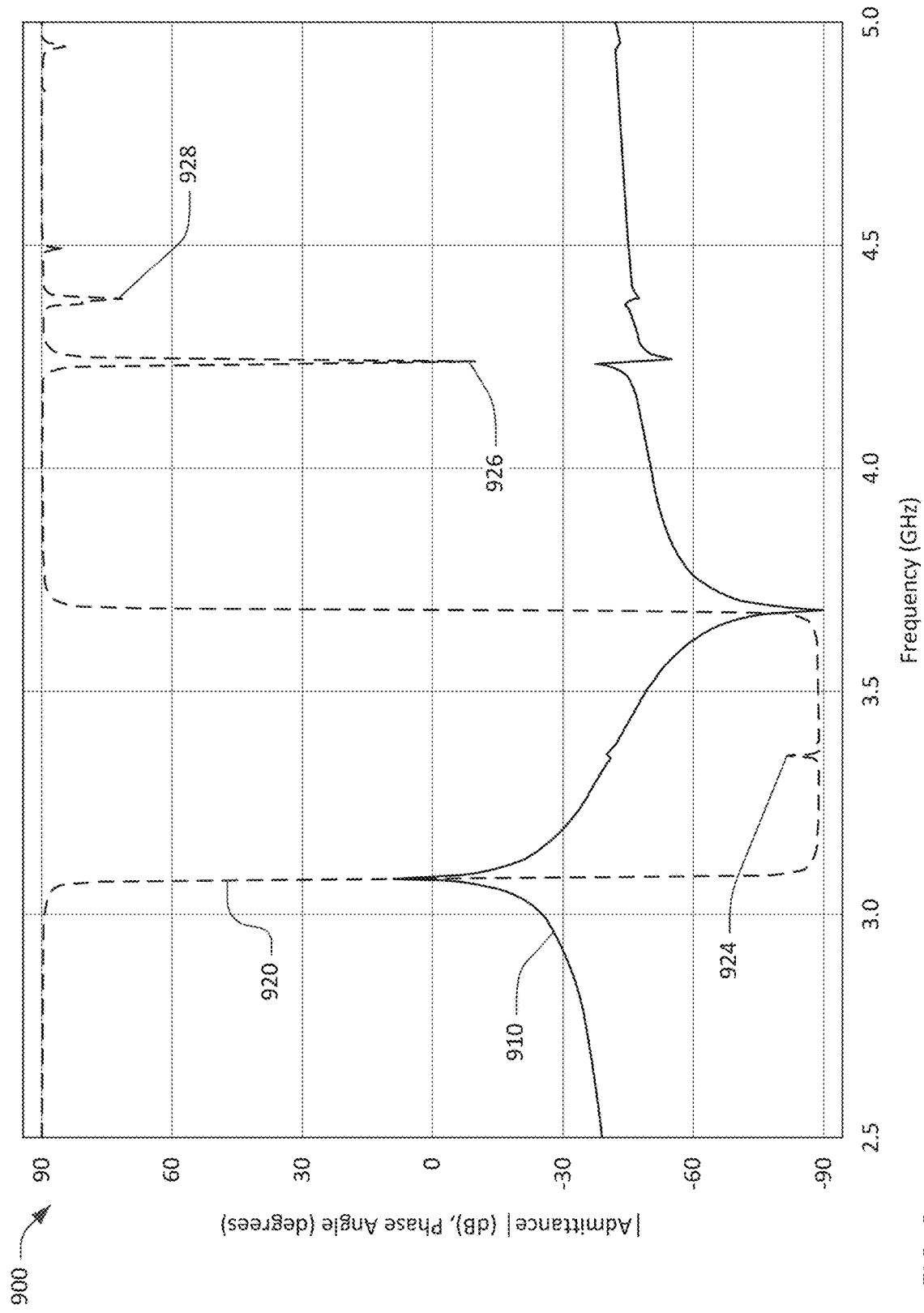
FIG. 9 is a graph of the magnitude and phase angle of the admittance of another XBAR as shown in FIG. 7.

FIG. 9 is a graph 900 of the admittance of another XBAR having the same structure as the XBAR of FIG. 8 except the Euler angles of the lithium niobate plate are [0°, 30°, 0°]. This may be referred to as 120-degree Y cut.

In FIG. 9, the solid curve 910 is a plot of the magnitude of the admittance of the XBAR as a function of frequency. The dashed line 920 is a plot of the phase of the admittance of the XBAR resonator as a function of frequency. The resonance frequency of the XBAR is about 3.1 GHz and the anti-resonance frequency is about 3.7 GHz. The large spurious mode (822 in FIG. 8) between the resonance and anti-resonance frequencies is not present with this piezoelectric plate cut angle. A smaller spurious mode 924 exists between the resonance and anti-resonance frequencies, and additional spurious modes 926, 928 occur above the antiresonance frequency. The substantial spurious mode 926 is again the A1-3 mode.

Figure 10:
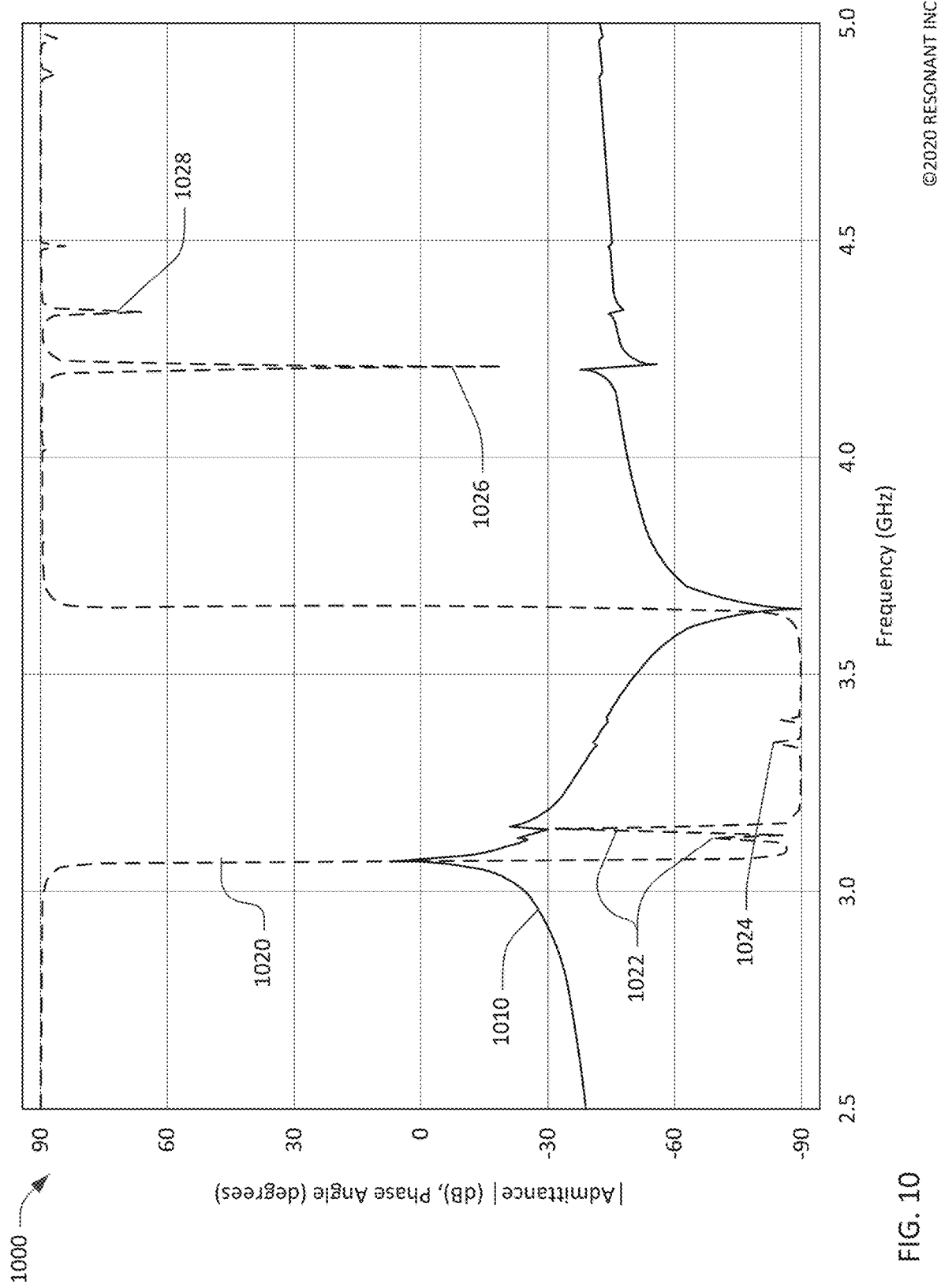
FIG. 10 is a graph of the magnitude and phase angle of the admittance of another XBAR as shown in FIG. 7.

FIG. 10 is a graph 1000 of the admittance of another XBAR having the same structure as the XBARs of FIG. 7 and FIG. 8 except the Euler angles of the lithium niobate plate are [0°, 20°, 0°]. This may be referred to as 110-degree Y cut.

In FIG. 10, the solid curve 1010 is a plot of the magnitude of the admittance of the XBAR as a function of frequency. The dashed line 1020 is a plot of the phase of the admittance of the XBAR resonator as a function of frequency. The resonance frequency of the XBAR is about 3.1 GHz and the anti-resonance frequency is about 3.7 GHz. There are substantial spurious modes 1022, 1024 between the resonance and anti-resonance frequencies, and additional spurious 1026, 1028 modes above the antiresonance frequency. The substantial spurious mode 1026 is again the A1-3 mode.

Figure 11:
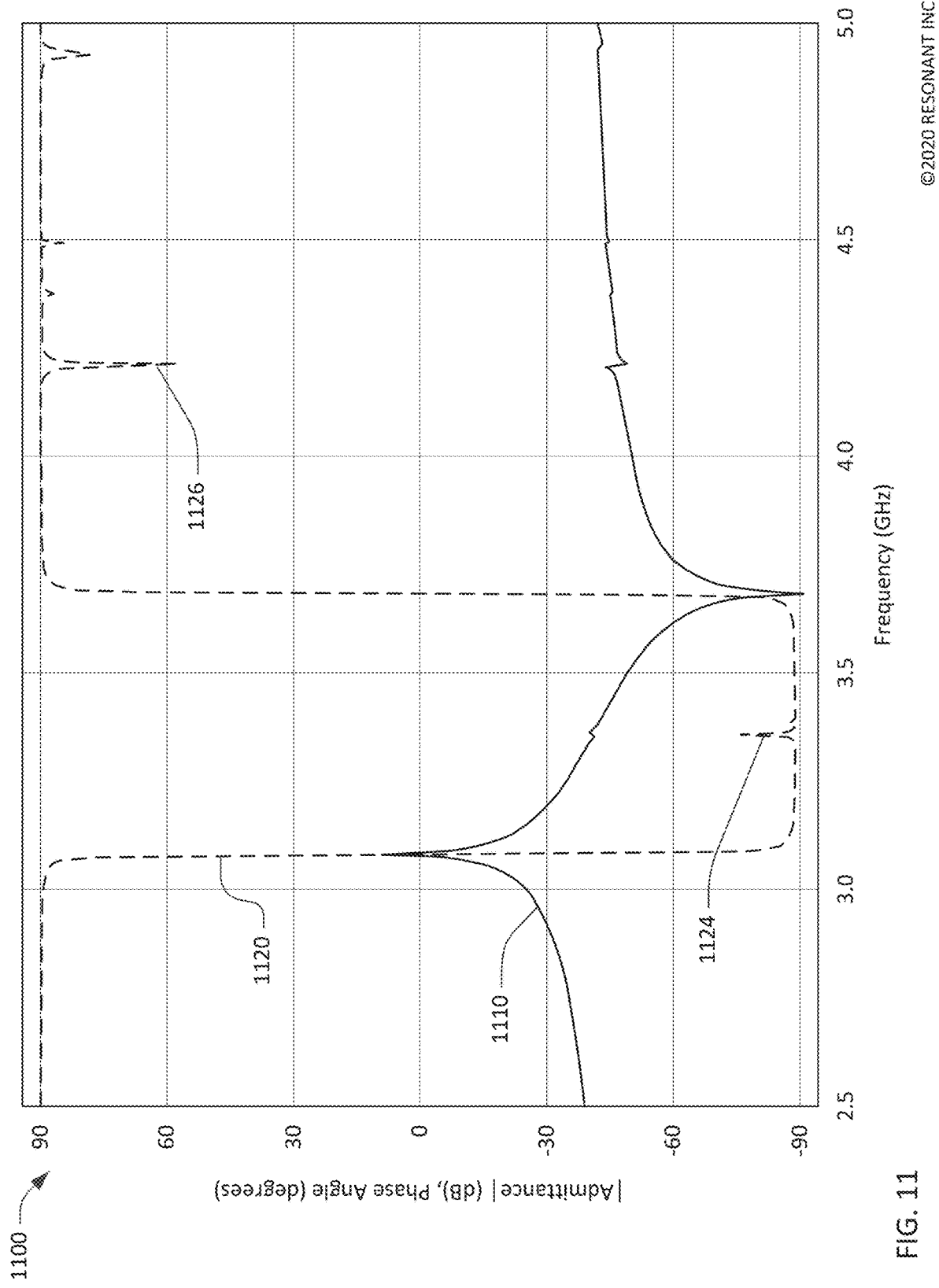
FIG. 11 is a graph of the magnitude and phase angle of the admittance of another XBAR as shown in FIG. 7.

FIG. 11 is a graph 1100 of the admittance of another XBAR having the same structure as the XBAR of FIG. 9, with Euler angles of the lithium niobate plate are [0°, 30°, 0°], except that the mark/space ratio of the IDT fingers is increase to 0.28.

In FIG. 11, the solid curve 1110 is a plot of the magnitude of the admittance of the XBAR as a function of frequency.

The dashed line 1120 is a plot of the phase of the admittance of the XBAR resonator as a function of frequency. Comparison with FIG. 9 shows increasing the mark/pitch ratio from 0.24 to 0.28 reduces the phase error due to the A1-3 spurious mode 1126 by about a factor of three. However, increasing the mark/pitch ratio from 0.24 to 0.28 increases the phase error due to the spurious mode 1124 by a factor of about 1.8. This is representative of the tradeoffs that occur in the design of individual XBARs for use in filters.

A lithium niobate piezoelectric plate with Euler angles substantially equal to [0°, 30°, 0°] may minimize spurious modes for symmetrical XBARs with the structure shown in FIG. 7. This is probably due to the coupling to the A0 mode being minimized for these Euler angles. It is expected that spurious modes will be low for lithium niobate piezoelectric plates with Euler angles equal to [0°, β, 0°], where 28°<β<32°. The relative strength of various spurious modes can be controlled by varying the mark/pitch ratio of the IDT fingers over a range of at least 0.24 to 0.28.

Figure 12:
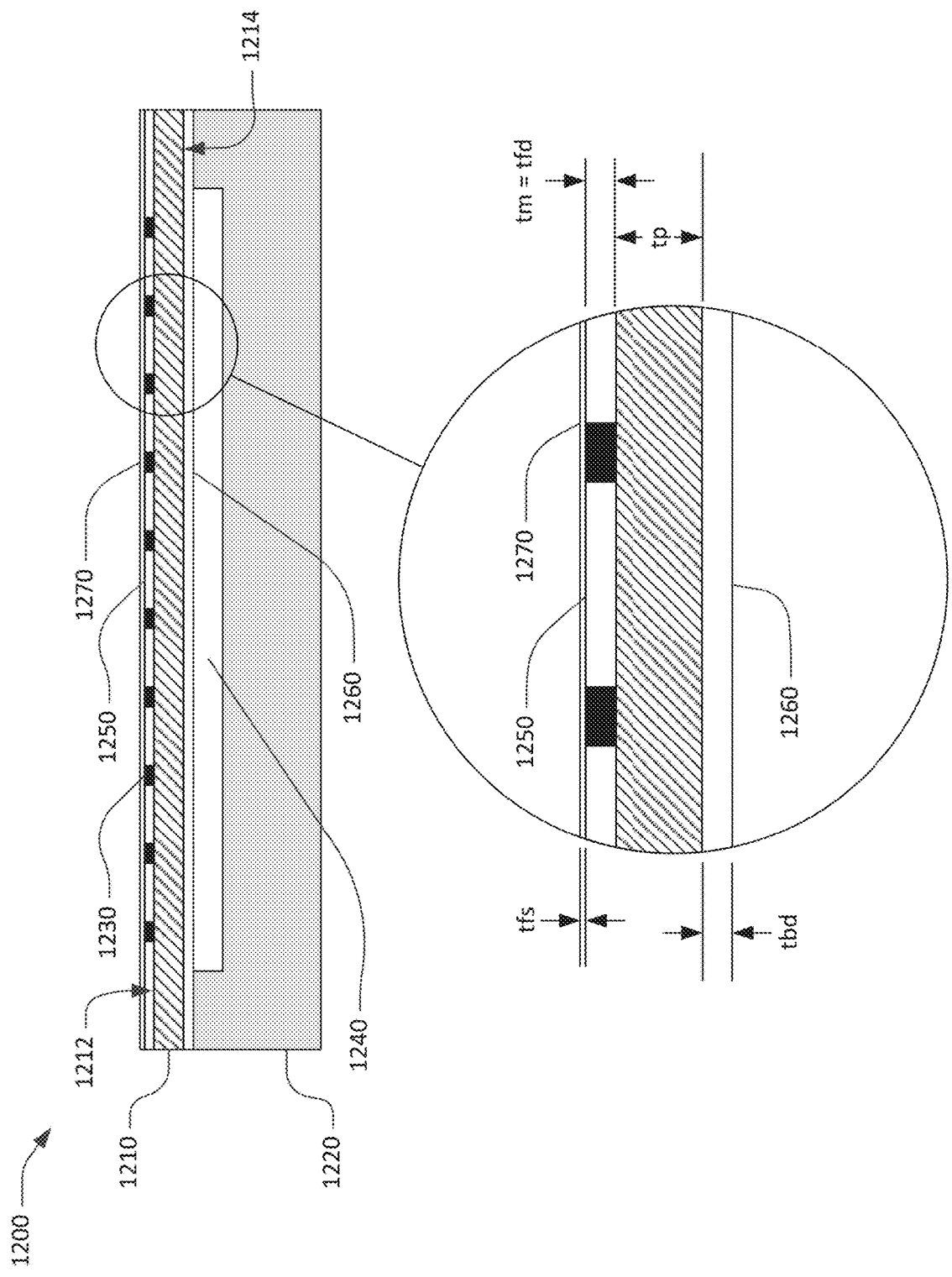
FIG. 12 is a cross-section view of a slightly asymmetrical XBAR with embedded IDT fingers on the front surface of a piezoelectric diaphragm and a continuous dielectric layer on the back surface of the diaphragm.

FIG. 12 is a schematic cross-sectional view of what may be called a "slightly asymmetrical" XBAR 1200. The XBAR 1200 includes a piezoelectric plate 1210 supported by a substrate 1220. The piezoelectric plate 1210 may be Z-cut, rotated Z-cut, or rotated YX-cut lithium niobate or lithium tantalate. The substrate 1220 may be silicon or some other material that allows the formation of deep cavities by, for example, isotropic etching. A portion of the piezoelectric plate 1210 forms a diaphragm spanning a cavity 1240 in the substrate 1220.

IDT fingers, such as finger 1230, are formed on a front surface 1212 of the diaphragm portion (i.e. the portion spanning the cavity 1240) of the piezoelectric plate 1210. The IDT fingers have a thickness tm. A front-side dielectric layer 1250 is formed on the front surface 1212 of the piezoelectric plate between the IDT fingers. The front-side dielectric layer 1250 has a thickness tfd. A back-side dielectric layer 1260 is formed on a back surface 1214 of the piezoelectric plate. The back-side dielectric layer 1260 has a thickness tbd. When the IDT fingers are aluminum and the front-side and back-side dielectric layers are silicon dioxide, tm=tfd=tbd. The elements 1210 to 1260 of the XBAR 1200 are essentially the same as the corresponding elements of the XBAR 70 of FIG. 7.

The XBAR 1200 also includes a frequency setting dielectric layer 1270 formed over the front-side dielectric layer and the IDT fingers. The function of the frequency setting dielectric layer is to lower the resonance and anti-resonance frequencies of the XBAR 1200 relative to the frequencies of a similar XBAR, such as the XBAR 700, without a frequency setting dielectric layer, as demonstrated in FIG. 13.

Figure 13:
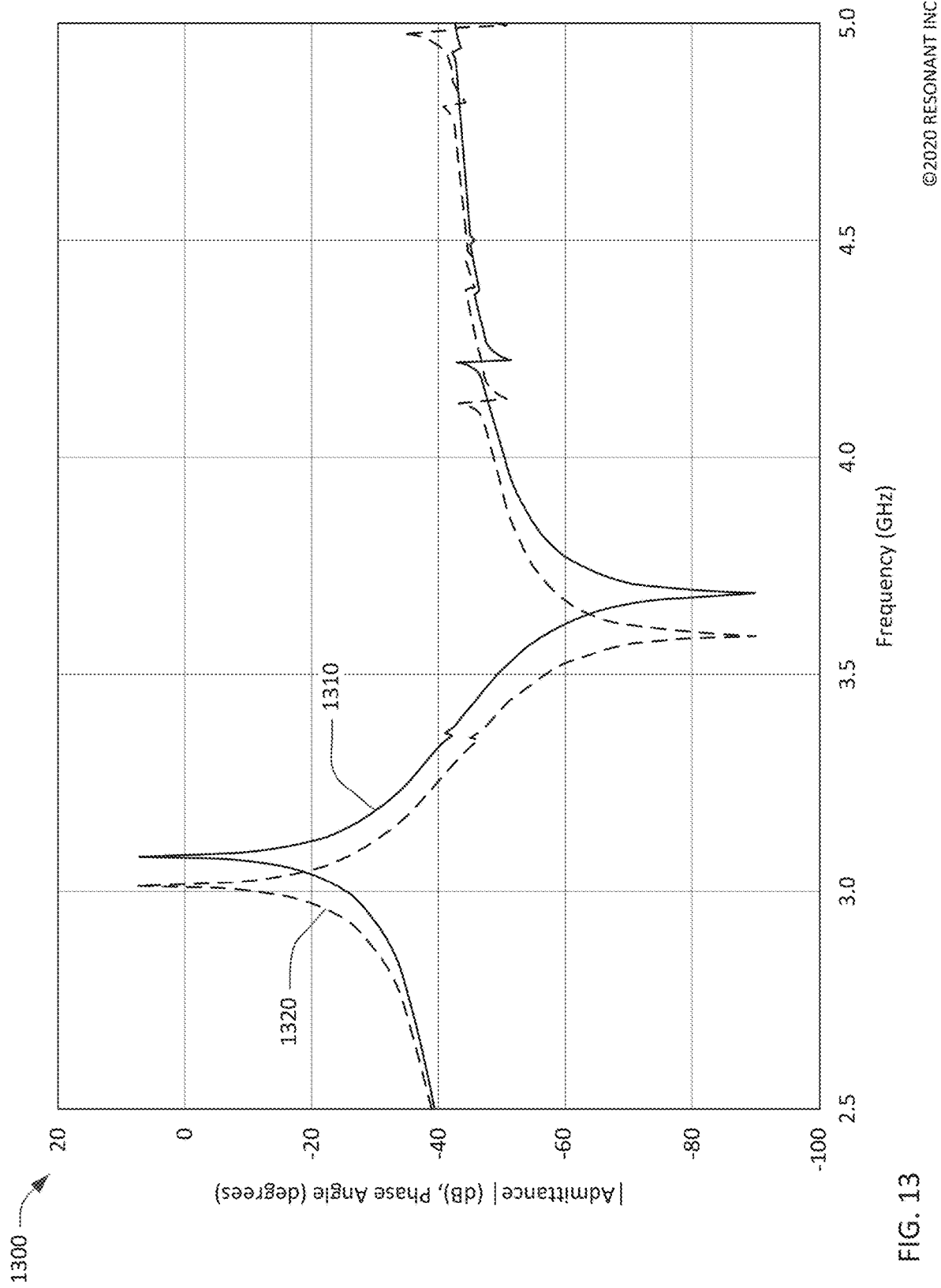
FIG. 13 is a graph comparing the magnitude and phase angle of the admittance of symmetric and slightly asymmetrical XBARs.

FIG. 13 is a graph 1300 comparing the admittances of XBARs with and without a frequency setting dielectric layer. The solid curve 1310 is a plot of the magnitude of the admittance of an XBAR without a frequency setting dielectric layer as a function of frequency. The dashed line 1320 is a plot of the magnitude of the admittance of an XBAR with a frequency setting dielectric layer as a function of frequency. For both cases, the piezoelectric plate is lithium niobate with Euler angles [0°, 120°, 0°]. The piezoelectric plate thickness is 445 nm. The thickness tm of the aluminum IDT fingers and the silicon dioxide dielectric layers tfd, tbd is 145 nm, or 0.326 times the thickness of the piezoelectric plate. The pitch of the IDT fingers is 4.5 microns and the mark/pitch ratio is 0.27. The thickness tfs of the frequency setting dielectric layer is 20 nm, which lowers the resonance and antiresonance frequencies about 65 MHz without introducing any significant new spurious modes.

Description of Methods

Figure 14:
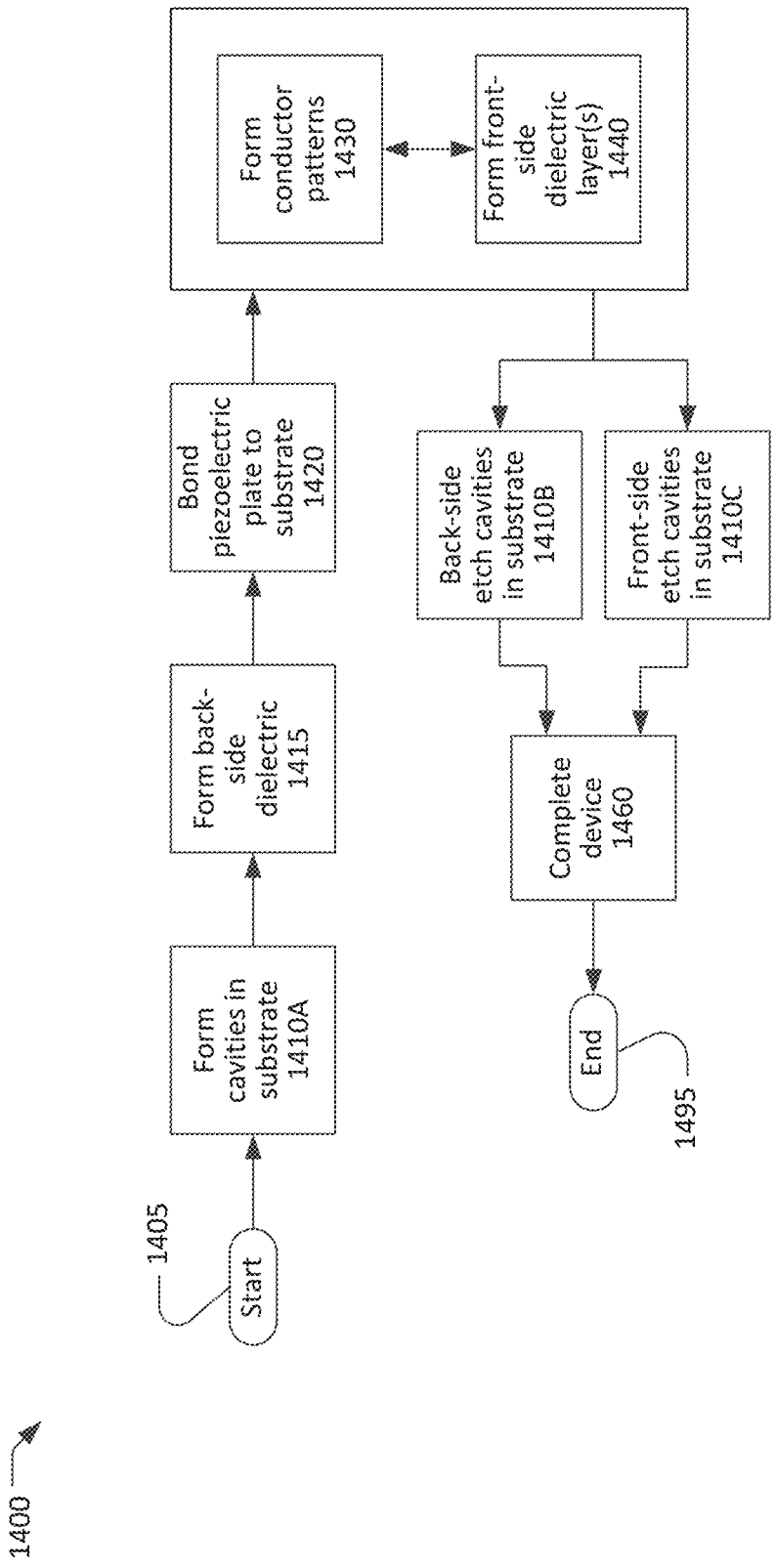
FIG. 14 is a flow chart of a method of fabricating an XBAR.

FIG. 14 is a simplified flow chart showing a process 1400 for making an XBAR or a filter incorporating XBARs. The process 1400 starts at 1405 with a substrate and a plate of piezoelectric material and ends at 1495 with a completed XBAR or filter. The flow chart of FIG. 14 includes only major process steps. Various conventional process steps (e.g. surface preparation, cleaning, inspection, baking, annealing, monitoring, testing, etc.) may be performed before, between, after, and during the steps shown in FIG. 14.

The flow chart of FIG. 14 captures three variations of the process 1400 for making an XBAR which differ in when and how cavities are formed in the substrate. The cavities may be formed at steps 1410A, 1410B, or 1410C. Only one of these steps is performed in each of the three variations of the process 1400.

The piezoelectric plate may be lithium niobate or lithium tantalate. The piezoelectric plate may be Z-cut, rotated Z-cut, or rotated YX-cut, or some other cut. The substrate may preferably be silicon. The substrate may be some other material that allows formation of deep cavities by etching or other processing.

In one variation of the process 1400, one or more cavities are formed in the substrate at 1410A, before the piezoelectric plate is bonded to the substrate at 1420. The cavity may be formed at 1410A before or after the back-side dielectric layer is formed at 1415. A separate cavity may be formed for each resonator in a filter device. The one or more cavities may be formed using conventional photolithographic and etching techniques. Typically, the cavities formed at 1410A will not penetrate through the substrate, and the resulting resonator devices will have a cross-section as shown in FIG. 3.

At 1415, the back-side dielectric layer may be formed by depositing silicon dioxide or another dielectric material on the back surface of the piezoelectric plate, the surface of the substrate, or both.

At 1420, the piezoelectric plate is bonded to the substrate such that the back-side dielectric layer is sandwiched between the substrate and the piezoelectric plate. The piezoelectric plate and the substrate may be bonded by a wafer bonding process. Typically, the mating surfaces of the substrate and the piezoelectric plate are highly polished. An intermediate material, which may be the back-side dielectric layer, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1430 by depositing and patterning one or more conductor layer on the front-side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

At 1440, a front-side dielectric layer may be formed by depositing one or more layers of dielectric material on the front-side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of a frequency setting dielectric layer on different portions of the piezoelectric plate corresponding to different shunt resonators.

The actions at 1430 and 1440 may be performed in either order or may be performed as a single integrated sequence of process steps. For example, the front-side dielectric layer may be deposited over the front surface of the piezoelectric plate. The front-side dielectric layer may then be coated with photoresist. The photoresist may then be exposed through a mask to define the areas where the IDT fingers and other conductors will be formed. The front-side dielectric layer may then be etched to remove the dielectric material from the areas where the IDT fingers and other conductors will be formed. The conductor metal can then be deposited to cover the remaining photoresist and fill the areas where the front-side dielectric layer was removed. The photoresist can then be stripped, lifting off the excess conductor metal and leaving the IDT fingers in the grooves previously etched in the front-side dielectric layer. The conductor pattern and the front-side dielectric layer may be formed using some other sequence of process steps.

In a second variation of the process 1400, one or more cavities are formed in the back-side of the substrate at 1410B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 1400, one or more cavities in the form of recesses in the substrate may be formed at 1410C by etching the substrate using an etchant introduced through openings in the piezoelectric plate. A separate cavity may be formed for each resonator in a filter device. The one or more cavities formed at 1410C will not penetrate through the substrate, and the resulting resonator devices will have a cross-section as shown in FIG. 3.

In all variations of the process 1400, the filter device is completed at 1460. Actions that may occur at 1460 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1460 is to tune the resonant frequencies of the resonators within the device by adding or removing metal or dielectric material from the front-side of the device. This tuning may also include selectively removing material from shunt resonators to create multiple frequency setting dielectric layer thicknesses. After the filter device is completed, the process ends at 1495.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a piezoelectric layer having front and back surfaces, the back surface attached to the surface of the substrate either directly or via one or more intermediate layers, the piezoelectric layer having a portion that forms a diaphragm that is over a cavity of the acoustic resonator device;
   a conductor pattern on the front surface of the piezoelectric layer, the conductor pattern including an interdigital transducer (IDT) having interleaved IDT fingers on the diaphragm; and
   a front-side dielectric layer on the front surface of the piezoelectric layer and between the interleaved IDT fingers,
   wherein:
   a thickness of the interleaved IDT fingers and a thickness of the front-side dielectric layer are substantially equal, and
   an acoustic impedance Zm of the interleaved IDT fingers and an acoustic impedance Zfd of the front-side dielectric layer satisfy the relationship $0.8 Zm \leq Zfd \leq 1.25 Zm$.

2. The device of claim 1, wherein the interleaved IDT fingers are substantially aluminum and the front-side dielectric layer is silicon oxide.

3. The device of claim 1, wherein the interleaved IDT fingers are substantially copper and the front-side dielectric layer is $Ta_2O_5$.

4. The device of claim 1, wherein the piezoelectric layer is lithium niobate with Euler angels of $[0°, \beta, 0°]$, where $28° \leq \beta \leq 32°$.

5. The device of claim 4, wherein a mark to pitch ratio of the interleaved IDT fingers is within a range from 0.24 to 0.28, and wherein the pitch is a center-to-center spacing between two adjacent interleaved IDT fingers extending from different busbars of the conductor pattern.

6. An acoustic resonator device comprising:
a substrate having a surface;
a piezoelectric layer having front and back surfaces, the back surface attached to the surface of the substrate either directly or via one or more intermediate layers, the piezoelectric layer having a diaphragm that is over a cavity;
a conductor pattern on the front surface of the piezoelectric layer, the conductor pattern including an interdigital transducer (IDT) having interleaved IDT fingers on the diaphragm;
a front-side dielectric layer on the front surface of the diaphragm and between the interleaved IDT fingers; and
a back-side dielectric layer on a back surface of the diaphragm,
wherein an acoustic thickness of the back-side dielectric layer is at least one-third and not more than two-thirds of a total acoustic thickness of the front-side dielectric layer and back-side dielectric layer combined.

7. The device of claim 1, further comprising:
a back-side dielectric layer on a back surface of the diaphragm,
wherein:
the front-side dielectric layer and the back side dielectric layer are a same material, and
a thickness tfd of the front-side dielectric layer and a thickness tbd of the back-side dielectric layer satisfy the relationship 0.5 tfd≤tbd≤1.5 tfd.

8. The device of claim 1, further comprising:
a back-side dielectric layer on a back surface of the diaphragm,
wherein:
the interleaved IDT fingers are substantially aluminum,
the front-side dielectric layer and the back-side dielectric layer are silicon oxide, and
a thickness of the interleaved IDT fingers, a thickness of the front-side dielectric layer, and a thickness of the back-side dielectric layer are substantially equal.

9. The device of claim 1, further comprising a frequency setting dielectric layer over the interleaved IDT fingers and the front-side dielectric layer.

10. The device of claim 1, further comprising a back-side dielectric layer on a back surface of the diaphragm, wherein the back-side dielectric layer covers the back surface of the piezoelectric layer and portions of the back-side dielectric layer are sandwiched between the piezoelectric layer and the substrate.

11. The device of claim 1, wherein the diaphragm is contiguous with the piezoelectric layer around at least 50% of a perimeter of the cavity.

12. The device of claim 1, wherein the piezoelectric layer and the IDT are configured such that a radio frequency signal applied to the IDT excites a primary shear acoustic wave within the diaphragm.

13. An acoustic filter device comprising:
a plurality of bulk acoustic resonators, with at least one of the plurality of bulk acoustic resonators comprising:
a substrate having a surface;
a piezoelectric layer having front and back surfaces, the back surface attached to the surface of the substrate via one or more intermediate layers and having a portion that forms a diaphragm that is over a cavity;
a conductor pattern on the front surface of the piezoelectric layer, the conductor pattern including an interdigital transducer (IDT) that includes interleaved IDT fingers on the respective diaphragm; and
a front-side dielectric layer on the front surface of the piezoelectric layer and between the IDT finger,
wherein:
a thickness of the interleaved IDT fingers and a thickness of the front-side dielectric layer are substantially equal, and
an acoustic impedance Zm of the interleaved IDT fingers and an acoustic impedance Zfd of the front-side dielectric layer satisfy the relationship 0.8Zm≤Zfd≤1.25Zm.

14. The filter device of claim 13, wherein the interleaved IDT fingers are substantially aluminum and the front-side dielectric layer is silicon oxide.

15. The filter device of claim 13, wherein the interleaved IDT fingers are substantially copper and the front-side dielectric layer is $Ta_2O_5$.

16. The filter device of claim 15, wherein a mark to pitch ratios of the interleaved IDT fingers of the at least one bulk acoustic resonator is within a range from 0.24 to 0.28, and wherein the pitch is a center-to-center spacing between two adjacent interleaved IDT fingers extending from different busbars of the conductor pattern of the at least one bulk acoustic resonator.

17. The filter device of claim 13, further comprising:
a back-side dielectric layer on a back surface of the diaphragm of the at least one bulk acoustic resonator,
wherein an acoustic thickness of the back-side dielectric layer is at least one-third and not more than two-thirds of a total acoustic thickness of the front-side and back-side dielectric layers of the at least one bulk acoustic resonator.

18. The filter device of claim 17, wherein:
the front-side dielectric layer and the back side dielectric layer are the same material, and
a thickness tfd of the front-side dielectric layer and a thickness tbd of the back-side dielectric layer satisfy the relationship 0.5 tfd≤tbd≤1.5 tfd.

19. The filter device of claim 13, further comprising a back-side dielectric layer formed on a back surface of the diaphragm of the at least one bulk acoustic resonator, wherein:
the interleaved IDT fingers are aluminum,
the front-side dielectric layer and the back-side dielectric layer are silicon oxide, and
a thickness of the interleaved IDT fingers, a thickness of the front-side dielectric layer, and a thickness of the back-side dielectric layer are substantially equal.

20. The filter device of claim 13, further comprising a frequency setting dielectric layer over the interleaved IDT fingers and the front-side dielectric layer of at least some of the plurality of acoustic resonators.

\* \* \* \* \*